(12) United States Patent
Earl

(10) Patent No.: US 6,330,203 B1
(45) Date of Patent: Dec. 11, 2001

(54) TEST MODE FOR VERIFICATION OF ON-CHIP GENERATED ROW ADDRESSES

(75) Inventor: Jeffrey S. Earl, San Jose, CA (US)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/747,233

(22) Filed: Dec. 26, 2000

(51) Int. Cl.$^7$ .................................................. G11C 13/02
(52) U.S. Cl. ............................................ 365/222; 365/201
(58) Field of Search .............................. 365/222, 230.01, 365/201, 185.21

(56) References Cited

U.S. PATENT DOCUMENTS

| | | | |
|---|---|---|---|
| 3,737,879 | * 6/1973 | Greene et al. ...................... 365/222 |
| 5,299,168 | 3/1994 | Kang ................................... 365/222 |
| 5,446,695 | 8/1995 | Douse et al. ....................... 365/222 |
| 5,703,823 | 12/1997 | Douse et al. ....................... 365/222 |
| 5,959,929 | 9/1999 | Cowles et al. ................. 365/230.03 |

* cited by examiner

Primary Examiner—Terrell W. Fears
(74) Attorney, Agent, or Firm—George O. Saile; Stephen B. Ackerman; Rosemary L. S. Pike

(57) ABSTRACT

Described is a method for verification of proper address generation in packet based memory protocol (Direct RDRAM) devices during the auto-refresh or self-refresh cycle that does not require changes to the interface logic or core signal generation. The method requires minimal additional logic while using the core control signals that function similarly to the RAS, CAS, and WE signals in a standard DRAM. Initially, high level (1) data are written to all of the memory cells of one bit line. The signals are manipulated, and a refresh is performed. As each memory cell is addressed during the refresh, the data are changed to a low level (0). Addressing is then verified by observing the data stored in the memory cells and confirming that a low level (0) is now stored. The method may be extended to standard DRAM devices.

24 Claims, 6 Drawing Sheets

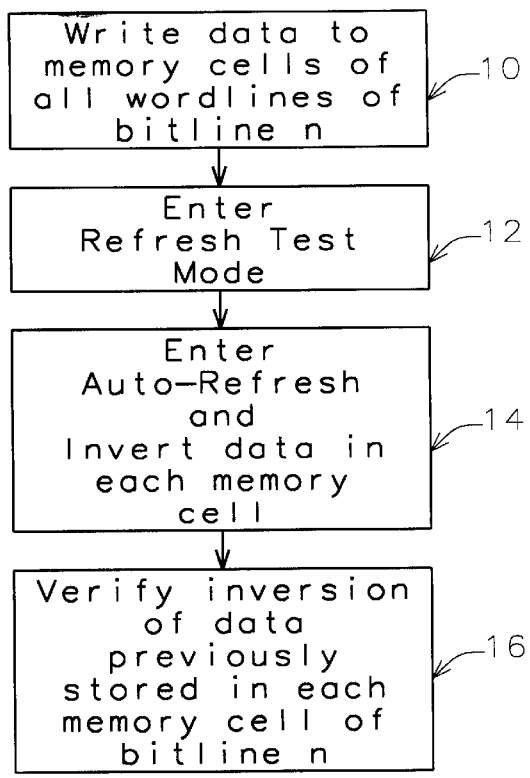
FIG. 1 Prior Art
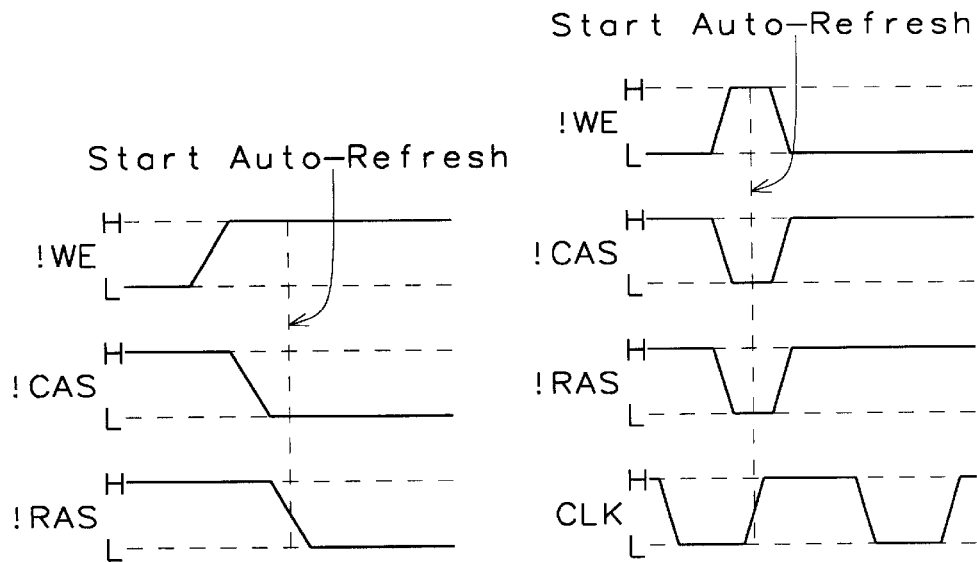
FIG. 2A Prior Art
FIG. 2B Prior Art

TEST MODE FOR VERIFICATION OF ON-CHIP GENERATED ROW ADDRESSES

BACKGROUND OF THE INVENTION (1) Field of the Invention

The invention generally relates to a semiconductor memory and more particularly, to a circuit and method to verify the generation of row addresses during auto-refresh or self-refresh of a dynamic random access memory (DRAM), fabricated on an integrated circuit (IC).

(2) Description of Prior Art

In a standard dynamic random access memory (DRAM), memory cells are arranged in an array. Each cell is connected to one of a plurality of word lines and to one of a plurality of bit lines. Memory addressing is provided by placing the proper voltage levels on the word and bit lines.

Each memory cell in the array of a typical DRAM is comprised of one metaloxide-semiconductor field-effect transistor (MOSFET) and a single capacitor. Binary data is stored to the memory cell by setting the level of charge on the capacitor. However, charge leakage on the capacitor requires that the capacitor be periodically refreshed (recharged) in order to maintain the original data charge level.

In typical DRAMs, this periodic refresh operation is controlled by internal circuitry, and is referred to as an auto-refresh or self-refresh operation. Self-refresh is initiated internally and generates refreshes based upon internal timing, while auto-refresh is initiated externally providing one refresh per external command. During this refresh, the write path to the memory array is locked out, and internally generated signals address the memory locations and rewrite the data to the memory cells. To test that the addresses are generated correctly, a test mode that allows the device to write data during the auto-refresh is generally used. This is achieved using minimal additional logic along with the external row address strobe (RAS), column address strobe (CAS), write enable (WE) and data signals. Refer now to FIG. 1 showing a flow diagram of testing of proper addressing of the word lines on one bit line. Initially, data are written to each of the plurality of memory locations with corresponding word lines on one of the bit lines (10). The refresh test mode is then initiated (12). An auto-refresh command results in the writing of inverted data to the wordline currently being accessed by the refresh operation (14). Validation of addressing is accomplished by observing that the originally stored data is inverted (16).

A typical timing diagram for auto-refresh entry for fast page (FP) and extended data output (EDO) RAM devices is shown in FIG. 2a, and for a synchronous DRAM (SDRAM) device in FIG. 2b. The auto-refresh is initiated by first bringing an active low write enable (!WE) to a high level This is followed by sequentially bringing the active low column address strobe (!CAS) and row address strobe (!RAS) to low (0). In FP and EDO RAM devices (FIG. 2a), this condition will initiate the auto-refresh cycle. In SDRAM devices (FIG. 2b), the clock (CLK) edge is used to synchronously start the auto-refresh when !WE, !CAS and !RAS are 1, 0 and 0, respectively.

A timing diagram for auto-refresh with a write after test mode entry (depicted in FIG. 1) for an FP or EDO device is shown in FIG. 3a Auto-refresh entry is accomplished as described earlier (in FIG. 2a). Inverted data is written to the memory cell when the three active low signals !RAS, !CAS and !WE are all low.

FIG. 3b shows a timing diagram for an auto-refresh with a write after test mode entry for a SDRAM. Auto-refresh entry is accomplished as depicted in FIG. 2b. Inverted data is synchronously written to the memory cell on the rising clock (CLK) edge when the three active low signals !RAS, !CAS and !WE are high (1), low (0) and low (0), respectively.

Since the self-refresh operation and auto-refresh operation use the same core control signals, (RAS, CAS and WE) the address generation testing for auto-refresh may be applied to the test mode used for self-refresh However, in packet based memory protocols (such as Direct Rambus DRAM or DRDRAM), the interface logic between the IC input/output (I/O) and memory array generate the refresh addresses and the core control signals (functioning similarly to RAS, CAS, WE, etc.). Since the core control signals may not be directly manipulated concurrently with a refresh operation, a write event cannot be initiated as easily as in a standard DRAM. Because of this, additional interface logic may be required to manipulate the core signals.

Other approaches for detecting refresh address signals in memory devices exist. U.S. Pat. No. 5,299,168 to Kang describes a circuit that stores the initial values of the refresh address counter (all 0s) and bit-wise compares them individually using an exclusive OR (XOR) to the final values of the refresh address counter (all 1s). The outputs of the plurality of XORs are ANDed; a high output at the end of the refresh cycle indicates that both logic states are possible on each of the bits of the refresh address counter. It fails to determine, however, if two of the refresh address counter bit lines are shorted together. U.S. Pat. No. 5,446,695 and 5,703,823 to Douse et al. teach a method with a self-refreshing circuit that permits programming and verification of the self-refresh time. U.S. Pat. No. 5,959,929 to Cowles et al. teaches a method for writing to multiple banks of a memory device. It permits different rows in the banks to be activated simultaneously.

SUMMARY OF THE INVENTION

A principal object of the present invention is to provide a circuit that facilitates verification of proper address generation in packet based memory protocol (Direct RDRAM) devices during the auto-refresh or self-refresh cycle.

A second object of the present invention is to provide a method for verification of proper address generation in packet based memory protocol (Direct RDRAM) devices during the auto-refresh or self-refresh cycle.

A further object of the present invention is to provide a circuit facilitating verification of proper address generation in packet based memory protocol (Direct RDRAM) devices during the auto-refresh or self refresh cycle that does not require changes to the interface logic or core signal generation.

A still further object of the present invention is to provide a circuit and method facilitating verification of proper address generation in DRAM devices during the auto-refresh or self-refresh cycle that does not require changes to the interface logic or core signal generation.

These objects are achieved using a method of verifying the generation of row addresses in a semiconductor memory comprising setting the logic level on all of a plurality of memory cells on one bit line of a semiconductor memory to a set level (all low or all high). Control signals are used to initialize a test mode and then to initiate a refresh cycle thereby sequentially addressing each word line of the memory cells and changing the logic level on the memory cells to the opposite level. Standard memory addressing is used to observe that the logic level on each of the memory cells has changed after exiting the test mode, thereby verifying proper generation of the row addresses. A memory cell that has not changed state after the test mode refresh cycle indicates a row addressing error.

Also, in accordance with the objects of this invention, a method of using a standard sense amplifier circuit facilitating proper verification of row address generation is achieved. This requires minimal additional logic while using the core control signals functioning similarly to the RAS, CAS, and WE signals in a standard DRAM. The difference between the prior art method of stimulating the sense amplifier circuit and the method of the present invention is the manipulation of the control signals during the test mode. The sense amplifier has two bit lines connected to a plurality of memory cell pass gates and memory cells each of which is addressed by a different word line. A shorting pass gate activated by signal EQ will connect the two bit lines together while two voltage pass gates activated by signal EQ set the voltage potential on the bit lines to signal VBLR. Two isolation pass gates activated by signal ISO connect each of the bit lines to one of two sense amplifier lines. A latch that depends upon the difference in voltage levels between the two sense amplifier lines and conditions of signals SAP and SAN will set and hold the sense amplifier lines to a logic high or low level. A pair of transfer gates which when activated by signal BS will transfer the logic level on each of the sense amplifier lines to one of two data output lines. Initially, all memory cells are programmed to the same logic level (all high or all low). During the test mode, the signals are manipulated so that VBLR is low and the SAP and SAN signals are set floating. Thereafter, a refresh is performed. As each memory cell is addressed during the refresh, the data are changed to the opposite state. Addressing is then verified by observing that the data stored in those memory cells has changed. An addressing error is indicated when any of the stored data remain in their initial logic state.

BRIEF DESCRIPTION OF THE DRAWINGS

In the accompanying drawings forming a material part of this description, there is shown:

FIG. 1 illustrating a flow diagram of the prior art in testing refresh addressing in standard DRAM devices;

FIGS. 2a and 2b showing prior art auto refresh timing diagrams for FP and EDO, and SDRAM devices respectively;

DESCRIPTION OF THE PREFERRED EMBODIMENTS

The preferred embodiment describes a method and circuit that facilitate verification of proper address generation of DRAM devices during an auto-refresh or self-refresh cycle. While this embodiment describes a specific circuit configuration, it will be understood by those skilled in the art that the invention can be extended to various circuit designs that will accomplish the equivalent task.

Figure 3A:
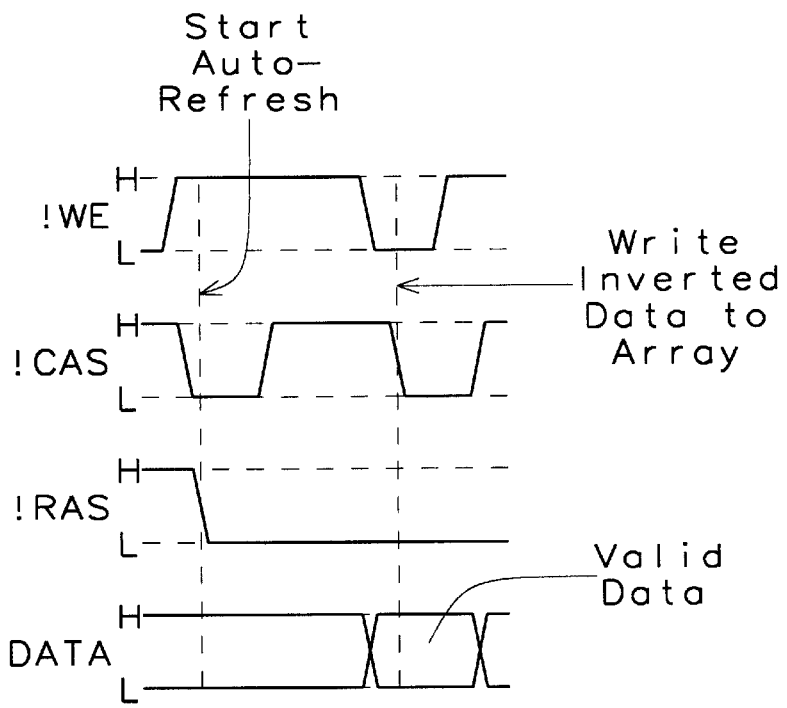
FIGS. 3a and 3b showing prior art address test verification after refresh timing diagrams for FP and EDO, and SDRAM devices respectively.
Figure 3B:
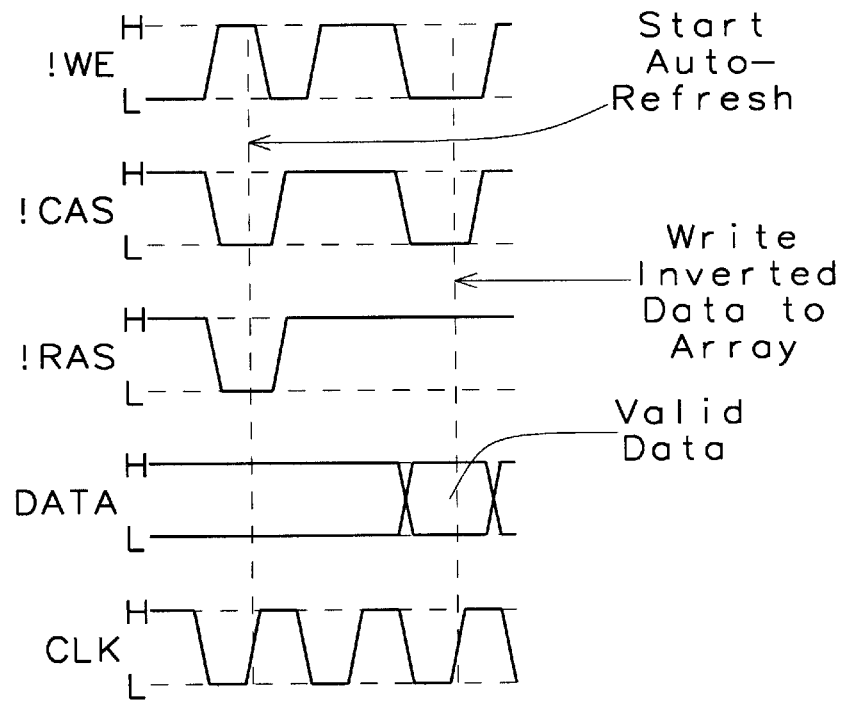
Figure 4:
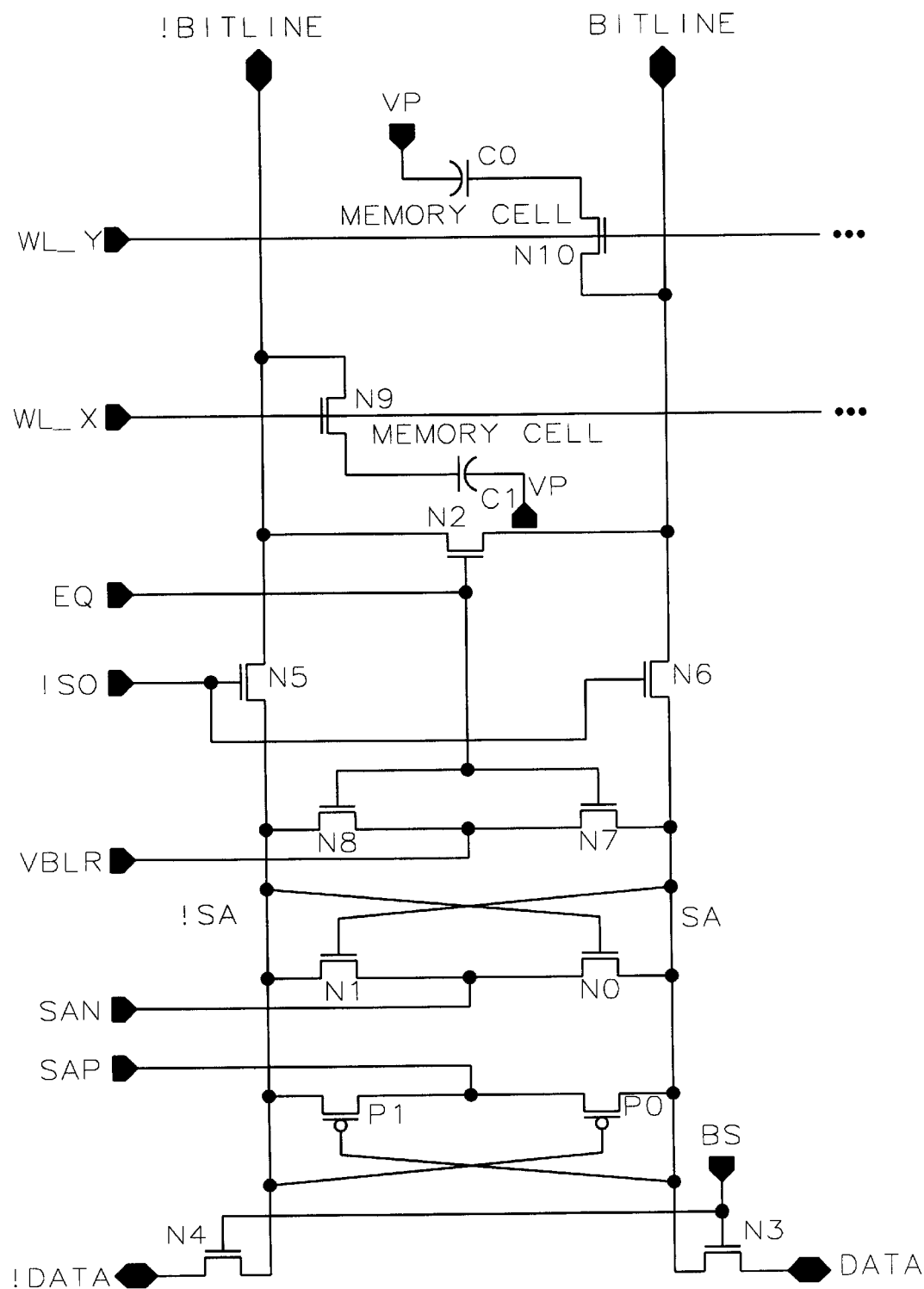
FIG. 4 schematically illustrating one embodiment of the sense amplifier circuit of the present invention.

Refer now to FIG. 4 showing a schematic diagram of a sense amplifier of the present invention used to verify on-chip generated row addresses. For illustrative purposes, this circuit uses two capacitive memory cells, C0 and C1, addressed by word lines WL_Y and WL_X respectively. In an actual circuit, there would be a plurality of word lines and corresponding memory cells. Only one of these plurality of word lines would be addressed at any given time.

Figure 5:
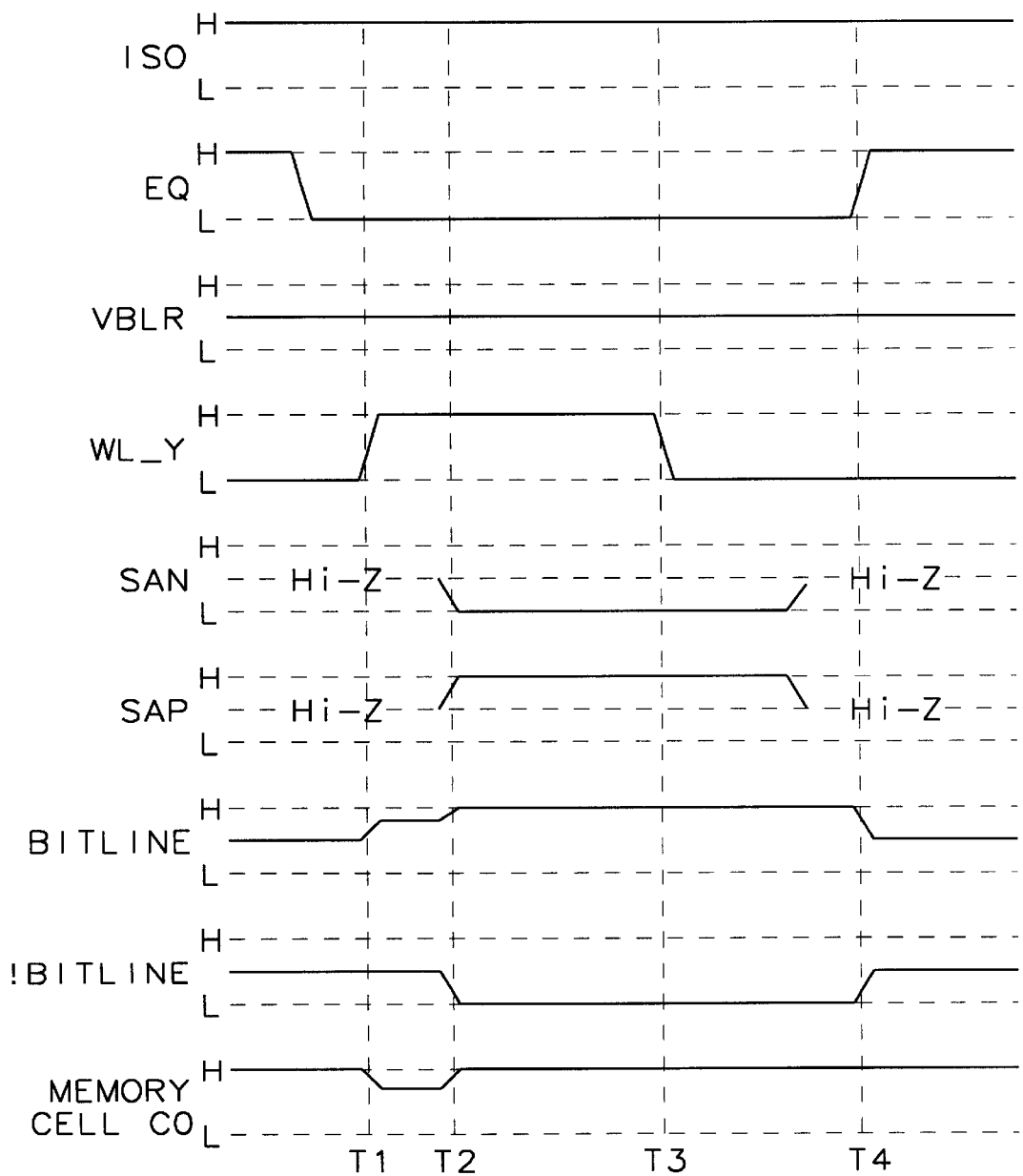
FIG. 5 illustrating the timing diagram of the normal word line access using the circuit of the present invention.

Refer now also to FIG. 5 showing a timing diagram for normal wordline access using the present invention In the normal mode, signal ISO is high, thereby connecting signals BITLINE and !BITLINE to signals SA and !SA, respectively, through n-channel FETs (NFET) N6 and N5. BITLINE and !BITLINE are precharged to VBLR by setting EQ high (1). When EQ is set low (0), then BITLINE and !BITLINE will float at VBLR. For this example, C0 is charged as shown in FIG. 5. At the start of a row operation (T1), WL_Y is asserted, allowing the NFET N10 to conduct. This transfers the charge on memory cell C0 to the signal BITLINE and SA raising the voltage potential on BITLINE and SA slightly, while reducing the voltage potential of the memory cell C0. Signals !BITLINE and !SA were floating. If the data in the memory cell C0 was a logic high (1) as shown in FIG. 5, signal SA will be slightly higher than !SA, and NFET N1 and p-channel FET (PFET) P0 will conduct. Conversely, if the data in the memory cell was a logic low (0) (not shown), signal SA will be slightly lower than !SA, and NFET N0 and p-channel FET (PFET) P1 will conduct. At time T2, signals SAN and SAP are pulled to a logic low (0) and high (1), respectively. This action latches the data on the sense amplifier signals BITLINE/SA and !BITLINE/!SA and sets them to a full logic high or logic low voltage level. (BITLINE will be high and !BITLINE will be low if C0 was charged.) At time T3, word line WL_Y is then deactivated and the full voltage potential on BITLINE and SA will be stored at the memory cell C0. By pulling bit select signal BS high (not shown), signals SA and !SA would be transferred to signals DATA and !DATA to be applied to the output data path logic (not shown). Signal EQ is pulled high, shorting BITLINE and !BITLINE together through NFET N2, and pulling them to the potential at signal VBLR through NFETs N7 and N8. During normal word line access, VBLR is held at approximately one-half of the supply voltage VDD.

Figure 6:
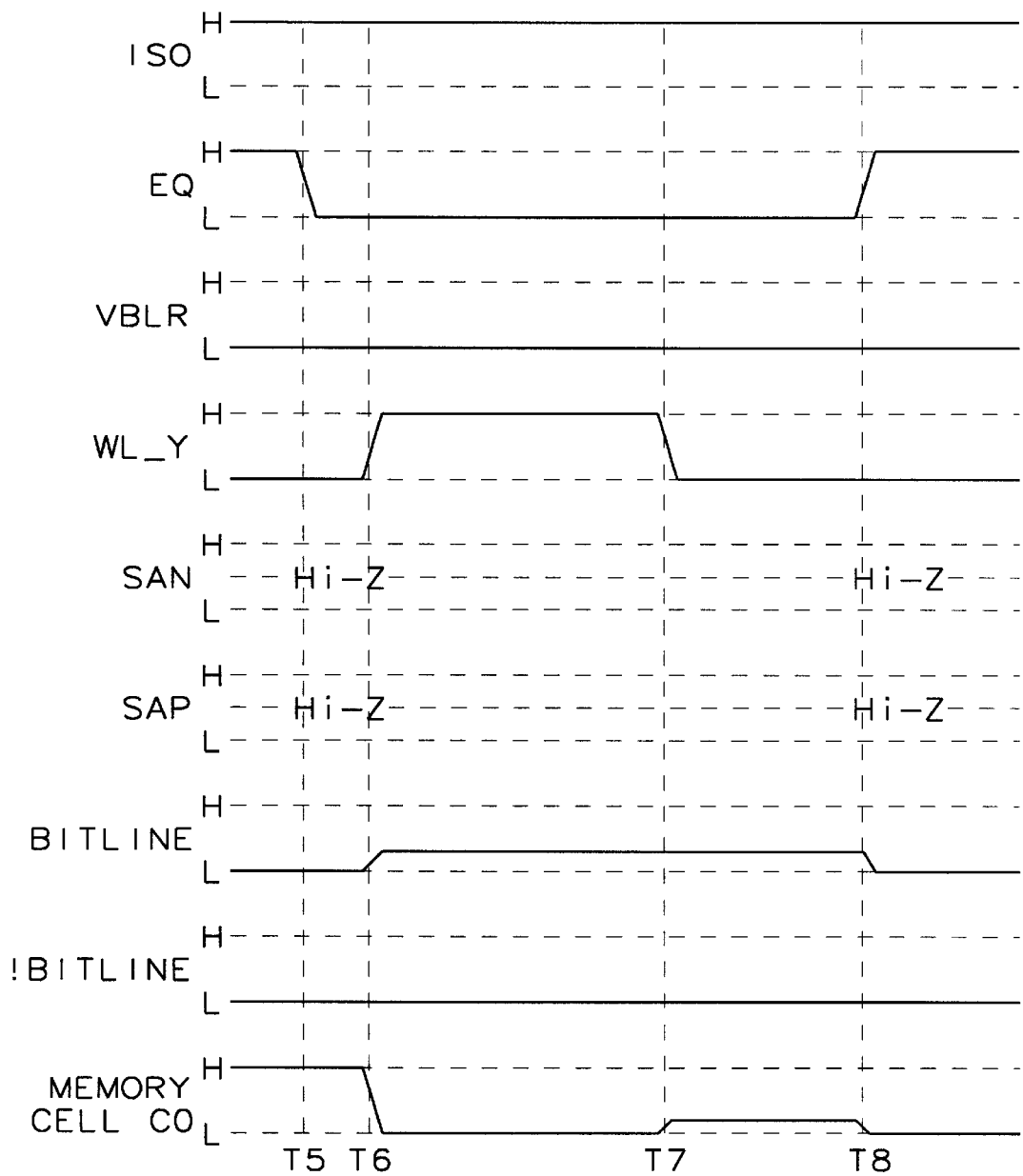
FIG. 6 illustrating the timing diagram of the word line access after refresh test mode using the circuit of the present invention.

Still referring to the circuit of FIG. 4, refer now to FIG. 6 showing a timing diagram for test mode operation of the sense amplifier of the present invention. Initially, a high level (1) is stored in each memory cell. Signals SAN and SAP are floating. Throughout the test mode cycle, signal ISO is held high (1), thereby connecting BITLINE to SA and !BITLINE to !SA. Prior to the assertion of word line WL_Y, signals EQ and VBLR are high (1) and low (0), respectively. This turns on NFETs N2, N7 and N8 forcing signals BITLINE, SA, !BITLINE and !SA all to a low (0) level (during normal operation these signals would be set to approximately one-half of the supply voltage VDD). P0 and P1 are off since the sources of those devices (SAP) are floating. At time T5, EQ is pulled low (0). When word line WL_Y is asserted (T6), NFET N10 conducts connecting the memory cell C0 to signals BITLINE/SA. Since BITLINE and SA were floating at a low level, the charge from memory cell C0 only raises the BITLINE voltage slightly above zero volts (0V). Since signals SAN and SAP remain floating, BITLINE will remain at this near zero voltage level. At time T7, WL_Y is de-addressed, and a voltage slightly greater than zero volts (0V) will be stored in C0. At T8, signal EQ returns to a high level (1) pulling BITLINE, SA, !BITLINE and !SA low (0).

Figure 7:
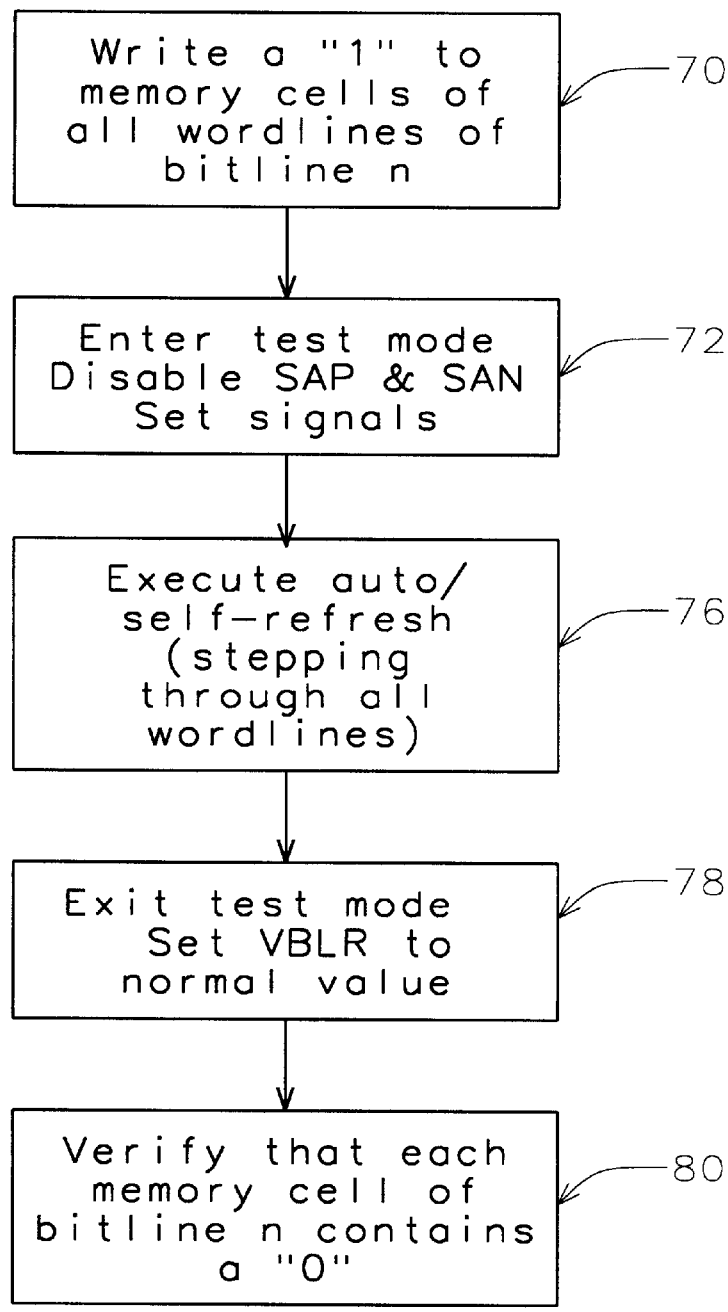
FIG. 7 illustrating a flow diagram of the method used to verify the word line access after refresh test mode of the present invention.

Refer now to FIG. 7 showing in a flow diagram the test mode after refresh operation for the present invention. Initially, high level (1) data are written to all of the plurality of memory cells attached to one of the bit lines (70). Entering the test mode, signals VBLR and EQ are low (0) and high (1), respectively (72). This forces signals BITLINE/SA and !BITLINE/!SA all to be low (0) (refer to FIG. 4). Signal EQ then becomes low. Auto-refresh or self-refresh are then executed (76), thereby addressing each of the plurality of memory cells and changing its stored data to a low level (0). After completing the auto-refresh or self-refresh, the test mode is exited and VBLR returns to approximately one-half of the supply voltage VDD (78). Normal word line access is then used to verify that all data in the bit line of interest are low (0), thereby confirming the proper refresh addressing of each word line (80). If any of the data in that bit line are high, a refresh addressing error has occurred. Unlike the previous method, which verifies only that each bit of the address counter changed logic state, this method assures that each decoded address has been asserted. In addition, since it is testing only the address generation, the previous method fails to determine if proper decoding of the refresh addresses has occurred.

The method of the present invention could be altered to initially store low (0) data to the plurality of memory cells, and verifying that the data are high (1) after test mode entry. For that situation, VBLR would be set to a high (1) potential during test mode entry. This would be less reliable, however, due to the $V_T$ drop across N7 and N8 would not allow a near full supply (VDD) level to be stored in the cell. The method and circuit of the present invention may also be applied to addressing verification for standard DRAM devices.

What is achieved by the present invention is a method and circuit used for verification of on-chip generated word line addresses requiring no changes to the interface logic or core signal generation. This results in a circuit savings. Without the test mode function, a costly long functional test would be required or some of the device functionality would need to be untested.

While the invention has been particularly shown and described with reference to the preferred embodiments thereof, it will be understood by those skilled in the art that various changes in form and details may be made without departing from the spirit and scope of the invention.

What is claimed is:

1. A method of verifying the generation of on-chip generated row addresses in a semiconductor memory comprising:
   setting the logic level on all of a plurality of memory cells on one bit line of said semiconductor memory to a high level;
   using control signals to initialize a test mode;
   using said control signals to initiate a refresh cycle of said plurality of memory cells, thereby sequentially addressing each word line of said plurality of memory cells and thereby sequentially changing said logic level on said plurality of memory cells to a low level; and
   using said control signals to observe that said logic level on each of said plurality of memory cells is a low level, thereby verifying proper generation of said row addresses.

2. The method for verifying the generation of on-chip generated row addresses in a semiconductor memory of claim 1 wherein after using said control signals to observe said logic level on each of said plurality of memory cells, the observation of one or more high levels on said memory cells indicates a row addressing error.

3. A method of verifying the generation of on-chip generated row addresses in a semiconductor memory comprising:
   setting the logic level on all of a plurality of memory cells on one bit line of said semiconductor memory to a low level;
   using control signals to initialize a test mode;
   using said control signals to initiate a refresh cycle of said plurality of memory cells, thereby sequentially addressing each word line of said plurality of memory cells and thereby sequentially changing said logic level on said plurality of memory cells to a high level; and
   using said control signals to observe that said logic level on each of said plurality of memory cells is a high level, thereby verifying proper generation of said row addresses.

4. The method for verifying the generation of on-chip generated row addresses in a semiconductor memory of claim 3 wherein after using said control signals to observe said logic level on each of said plurality of memory cells, the observation of one or more low levels on said memory cells indicates a row addressing error.

5. A method of verifying the generation of on-chip generated row addresses in a dynamic read only memory (DRAM) semiconductor memory comprising:
   setting the logic level on all of a plurality of memory cells on one bit line of said semiconductor memory to a high level;
   using control signals to initialize a test mode;
   using said control signals to initiate a refresh cycle of said plurality of memory cells, thereby sequentially addressing each word line of said plurality of memory cells and thereby sequentially changing said logic level on said plurality of memory cells to a low level; and
   using said control signals to observe that said logic level on each of said plurality of memory cells is a low level, thereby verifying proper generation of said row addresses.

6. The method of verifying the generation of on-chip generated row addresses in a dynamic read only memory (DRAM) semiconductor memory of claim 5 wherein after using said control signals to observe said logic level on each of said plurality of memory cells, the observation of one or more high levels on said memory cells indicates a row addressing error.

7. A method of verifying the generation of on-chip generated row addresses in a dynamic read only memory (DRAM) semiconductor memory comprising:
   setting the logic level on all of a plurality of memory cells on one bit line of said semiconductor memory to a low level;
   using control signals to initialize a test mode;
   using said control signals to initiate a refresh cycle of said plurality of memory cells, thereby sequentially addressing each word line of said plurality of memory cells and thereby sequentially changing said logic level on said plurality of memory cells to a high level; and
   using said control signals to observe that said logic level on each of said plurality of memory cells is a high level, thereby verifying proper generation of said row addresses.

8. The method of verifying the generation of on-chip generated row addresses in a dynamic read only memory (DRAM) semiconductor memory of claim 7 wherein after using said control signals to observe said logic level on each of said plurality of memory cells, the observation of one or more low levels on said memory cells indicates a row addressing error.

9. A method of verifying the generation of on-chip generated row addresses in a packet based memory protocol (Direct RDRAM) semiconductor memory comprising:
   setting the logic level on all of a plurality of memory cells on one bit line of said semiconductor memory to a high level;
   using control signals to initialize a test mode;
   using said control signals to initiate a refresh cycle of said plurality of memory cells, thereby sequentially addressing each word line of said plurality of memory cells and thereby sequentially changing said logic level on said plurality of memory cells to a low level; and
   using said control signals to observe that said logic level on each of said plurality of memory cells is a low level, thereby verifying proper generation of said row addresses.

10. The method of verifying the generation of on-chip generated row addresses in a packet based memory protocol (Direct RDRAM) semiconductor memory of claim 9 wherein after using said control signals to observe said logic level on each of said plurality of memory cells, the observation of one or more high levels on said memory cells indicates a row addressing error.

11. A method of verifying the generation of on-chip generated row addresses in a packet based memory protocol (Direct RDRAM) semiconductor memory comprising:
   setting the logic level on all of a plurality of memory cells on one bit line of said semiconductor memory to a low level;
   using control signals to initialize a test mode;
   using said control signals to initiate a refresh cycle of said plurality of memory cells, thereby sequentially addressing each word line of said plurality of memory cells and thereby sequentially changing said logic level on said plurality of memory cells to a high level; and
   using said control signals to observe that said logic level on each of said plurality of memory cells is a high level, thereby verifying proper generation of said row addresses.

12. The method of verifying the generation of on-chip generated row addresses in a packet based memory protocol (Direct RDRAM) semiconductor memory of claim 11 wherein after using said control signals to observe said logic level on each of said plurality of memory cells, the observation of one or more low levels on said memory cells indicates a row addressing error.

13. A method for verifying the generation of on-chip generated row addresses in a semiconductor memory comprising:
   using a sense amplifier comprising:
      two bit lines connected to a plurality of memory cell pass gates and memory cells each of which is addressed by a different word line;
      a shorting pass gate which when activated by signal EQ connects said bit lines together;
      two voltage pass gates which when activated by said signal EQ set the voltage potential on said bit lines to signal VBLR;
      two isolation pass gates which when activated by signal ISO connect one of said bit lines to one of two sense amplifier lines;
      a latch whereby said latch will set the first of said sense amplifiers lines high and the second of said sense amplifier lines low when the voltage on said first of said sense amplifier lines is slightly higher than the voltage of said second of said sense amplifier lines and signals SAN and SAP are low and high, respectively; and
      a pair of transfer gates which when activated by signal BS will transfer the logic level on each of said sense amplifier lines to one of two data output lines; and
   wherein each of said memory cells is initially set to a high level, then, during a test mode wherein ISO is high, EQ and VBLR are low, and SAN and SAP are floating, as each of said memory cells is addressed, the data on said memory cells are set to a low level, thereby confirming proper addressing.

14. A method for verifying the generation of on-chip generated row addresses in a semiconductor memory comprising:
   using a sense amplifier comprising:
      two bit lines connected to a plurality of memory cell pass gates and memory cells each of which is addressed by a different word line;
      a shorting pass gate which when activated by signal EQ connects said bit lines together;
      two voltage pass gates which when activated by said signal EQ set the voltage potential on said bit lines to signal VBLR;
      two isolation pass gates which when activated by signal ISO connect one of said bit lines to one of two sense amplifier lines;
      a latch whereby said latch will set the first of said sense amplifiers lines high and the second of said sense amplifier lines low when the voltage on said first of said sense amplifier lines is slightly higher than the voltage of said second of said sense amplifier lines and signals SAN and SAP are low and high, respectively; and
      a pair of transfer gates which when activated by signal BS will transfer the logic level on each of said sense amplifier lines to one of two data output lines; and
   wherein each of said memory cells is initially set to a low level, then, during a test mode wherein ISO is high, EQ and VBLR are low, and SAN and SAP are floating, as each of said memory cells is addressed, the data on said memory cells are set to a high level, thereby confirming proper addressing.

15. A method for verifying the generation of on-chip generated row addresses in a dynamic read only memory (DRAM) semiconductor memory comprising:
   using a sense amplifier comprising:
      two bit lines connected to a plurality of memory cell pass gates and memory cells each of which is addressed by a different word line;
      a shorting pass gate which when activated by signal EQ connects said bit lines together;
      two voltage pass gates which when activated by said signal EQ set the voltage potential on said bit lines to signal VBLR;
      two isolation pass gates which when activated by signal ISO connect one of said bit lines to one of two sense amplifier lines;
      a latch whereby said latch will set the first of said sense amplifiers lines high and the second of said sense amplifier lines low when the voltage on said first of said sense amplifier lines is slightly higher than the voltage of said second of said sense amplifier lines and signals SAN and SAP are low and high, respectively; and a pair of transfer gates which when activated by signal BS will transfer the logic level on each of said sense amplifier lines to one of two data output lines; and wherein each of said memory cells is initially set to a high level, then, during a test mode wherein ISO is high, EQ and VBLR are low, and SAN and SAP are floating, as each of said memory cells is addressed, the data on said memory cells are set to a low level, thereby confirming proper addressing.

16. A method for verifying the generation of on-chip generated row addresses in a dynamic read only memory (DRAM) semiconductor memory comprising:

using a sense amplifier comprising:

two bit lines connected to a plurality of memory cell pass gates and memory cells each of which is addressed by a different word line;

a shorting pass gate which when activated by signal EQ connects said bit lines together;

two voltage pass gates which when activated by said signal EQ set the voltage potential on said bit lines to signal VBLR;

two isolation pass gates which when activated by signal ISO connect one of said bit lines to one of two sense amplifier lines;

a latch whereby said latch will set the first of said sense amplifiers lines high and the second of said sense amplifier lines low when the voltage on said first of said sense amplifier lines is slightly higher than the voltage of said second of said sense amplifier lines and signals SAN and SAP are low and high, respectively; and a pair of transfer gates which when activated by signal BS will transfer the logic level on each of said sense amplifier lines to one of two data output lines; and wherein each of said memory cells is initially set to a low level, then, during a test mode wherein ISO is high, EQ and VBLR are low, and SAN and SAP are floating, as each of said memory cells is addressed, the data on said memory cells are set to a high level, there by confirming proper addressing.

17. A method for verifying the generation of on-chip generated row addresses in a packet based memory protocol (Direct RDRAM) semiconductor memory comprising:

using a sense amplifier comprising:

two bit lines connected to a plurality of memory cell pass gates an d memory cells each of which is addressed by a different word line;

a shorting pass gate which when activated by signal EQ connects said bit lines together;

two voltage pass gates which when activated by said signal EQ set the voltage potential on said bit lines to signal VBLR;

two isolation pass gates which when activated by signal ISO connect one of said bit lines to one of two sense amplifier lines;

a latch whereby said latch will set the first of said sense amplifiers lines high and the second of said sense amplifier lines low when the voltage on said first of said sense amplifier lines is slightly higher than the voltage of said second of said sense amplifier lines and signals SAN and SAP are low and high, respectively; and a pair of transfer gates which when activated by signal BS will transfer the logic level on each of said sense amplifier lines to one of two data output lines; and wherein each of said memory cells is initially set to a high level, then, during a test mode wherein ISO is high, EQ and VBLR are low, and SAN and SAP are floating, as each of said memory cells is addressed, the data on said memory cells are set to a low level, thereby confirming proper addressing.

18. A method for verifying the generation of on-chip generated row addresses in a packet based memory protocol (Direct RDRAM) semiconductor memory comprising:

using a sense amplifier comprising:

two bit lines connected to a plurality of memory cell pass gates and memory cells each of which is addressed by a different word line;

a shorting pass gate which when activated by signal EQ connects said bit lines together;

two voltage pass gates which when activated by said signal EQ set the voltage potential on said bit lines to signal VBLR;

two isolation pass gates which when activated by signal ISO connect one of said bit lines to one of two sense amplifier lines;

a latch whereby said latch will set the first of said sense amplifiers lines high and the second of said sense amplifier lines low when the voltage on said first of said sense amplifier lines is slightly higher than the voltage of said second of said sense amplifier lines and signals SAN and SAP are low and high, respectively; and a pair of transfer gates which when activated by signal BS will transfer the logic level on each of said sense amplifier lines to one of two data output lines; and wherein each of said memory cells is initially set to a low level, then, during a test mode wherein ISO is high, EQ and VBLR are low, and SAN and SAP are floating, as each of said memory cells is addressed, the data on said memory cells are set to a high level, thereby confirming proper addressing.

19. A method of verifying the generation of on-chip generated row addresses in a semiconductor memory comprising:

setting the logic level on all of a plurality of memory cells on one bit line of said semiconductor memory to a high level;

setting the SAP and SAN control signals to a floating (high impedance) level;

setting the ISO control signal to a high level;

setting the logic level on the VBLR control signals to a low level;

setting the logic level on the EQ control signal to a high level thereby setting the level on a plurality of bitlines to a low logic level;

setting the logic level on the EQ control signal to a low level;

using said control signals to initiate a refresh cycle of said plurality of memory cells, thereby sequentially addressing each word line of said plurality of memory cells and thereby sequentially changing said logic level on said plurality of memory cells to said low level stored on said plurality of bitlines; and using said control signals to observe that said logic level on each of said plurality of memory cells is a low level, thereby verifying proper generation of said row addresses.

20. A method of verifying the generation of on-chip generated row addresses in a semiconductor memory comprising:

setting the logic level on all of a plurality of memory cells on one bit line of said semiconductor memory to a low level;

setting the SAP and SAN control signals to a floating (high impedance) level;

setting the ISO control signal to a high level;

setting the logic level on the VBLR control signals to a high level;

setting the logic level on the EQ control signal to a high level thereby setting the level on a plurality of bitlines to a high logic level;

setting the logic level on the EQ control signal to a low level;

using said control signals to initiate a refresh cycle of said plurality of memory cells, thereby sequentially addressing each word line of said plurality of memory cells and thereby sequentially changing said logic level on said plurality of memory cells to said high level stored on said plurality of bitlines; and using said control signals to observe that said logic level on each of said plurality of memory cells is a high level, thereby verifying proper generation of said row addresses.

21. A method of verifying the generation of on-chip generated row addresses in a dynamic read only memory (DRAM) semiconductor memory comprising:

setting the logic level on all of a plurality of memory cells on one bit line of said semiconductor memory to a high level;

setting the SAP and SAN control signals to a floating (high impedance) level;

setting the ISO control signal to a high level;

setting the logic level on the VBLR control signals to a low level;

setting the logic level on the EQ control signal to a high level thereby setting the level on a plurality of bitlines to a low logic level;

setting the logic level on the EQ control signal to a low level;

using said control signals to initiate a refresh cycle of said plurality of memory cells, thereby sequentially addressing each word line of said plurality of memory cells and thereby sequentially changing said logic level on said plurality of memory cells to said low level stored on said plurality of bitlines; and using said control signals to observe that said logic level on each of said plurality of memory cells is a low level, thereby verifying proper generation of said row addresses.

22. A method of verifying the generation of on-chip generated row addresses in a dynamic read only memory (DRAM) semiconductor memory comprising:

setting the logic level on all of a plurality of memory cells on one bit line of said semiconductor memory to a low level;

setting the SAP and SAN control signals to a floating (high impedance) level;

setting the ISO control signal to a high level;

setting the logic level on the VBLR control signals to a high level;

setting the logic level on the EQ control signal to a high level thereby setting the level on a plurality of bitlines to a high logic level;

setting the logic level on the EQ control signal to a low level;

using said control signals to initiate a refresh cycle of said plurality of memory cells, thereby sequentially addressing each word line of said plurality of memory cells and thereby sequentially changing said logic level on said plurality of memory cells to said high level stored on said plurality of bitlines; and using said control signals to observe that said logic level on each of said plurality of memory cells is a high level, thereby verifying proper generation of said row addresses.

23. A method of verifying the generation of on-chip generated row addresses in a packet based memory protocol (Direct RDRAM) semiconductor memory comprising:

setting the logic level on all of a plurality of memory cells on one bit line of said semiconductor memory to a high level;

setting the SAP and SAN control signals to a floating (high impedance) level;

setting the ISO control signal to a high level;

setting the logic level on the VBLR control signals to a low level;

setting the logic level on the EQ control signal to a high level thereby setting the level on a plurality of bitlines to a low logic level;

setting the logic level on the EQ control signal to a low level;

using said control signals to initiate a refresh cycle of said plurality of memory cells, thereby sequentially addressing each word line of said plurality of memory cells and thereby sequentially changing said logic level on said plurality of memory cells to said low level stored on said plurality of bitlines; and using said control signals to observe that said logic level on each of said plurality of memory cells is a low level, thereby verifying proper generation of said row addresses.

24. A method of verifying the generation of on-chip generated row addresses in a packet based memory protocol (Direct RDRAM) semiconductor memory comprising:

setting the logic level on all of a plurality of memory cells on one bit line of said semiconductor memory to a low level;

setting the SAP and SAN control signals to a floating (high impedance) level;

setting the ISO control signal to a high level;

setting the logic level on the VBLR control signals to a high level;

setting the logic level on the EQ control signal to a high level thereby setting the level on a plurality of bitlines to a high logic level;

setting the logic level on the EQ control signal to a low level;

using said control signals to initiate a refresh cycle of said plurality of memory cells, thereby sequentially addressing each word line of said plurality of memory cells and thereby sequentially changing said logic level on said plurality of memory cells to said high level stored on said plurality of bitlines; and using said control signals to observe that said logic level on each of said plurality of memory cells is a high level, thereby verifying proper generation of said row addresses.

* * * * *